United States Patent
Lin et al.

(10) Patent No.: US 9,613,931 B2
(45) Date of Patent: Apr. 4, 2017

(54) FAN-OUT STACKED SYSTEM IN PACKAGE (SIP) HAVING DUMMY DIES AND METHODS OF MAKING THE SAME

(71) Applicant: Taiwan Semiconductor Manufacturing Company, Ltd., Hsin-Chu (TW)

(72) Inventors: Tsung-Shu Lin, New Taipei (TW); Hsien-Wei Chen, Hsin-Chu (TW); Cheng-Chieh Hsieh, Tainan County (TW); Chang-Chia Huang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/701,255

(22) Filed: Apr. 30, 2015

(65) Prior Publication Data

US 2016/0322330 A1 Nov. 3, 2016

(51) Int. Cl.
*H01L 25/065* (2006.01)
*H01L 25/00* (2006.01)
*H01L 25/04* (2014.01)
*H01L 25/07* (2006.01)

(52) U.S. Cl.
CPC .......... *H01L 25/0652* (2013.01); *H01L 25/50* (2013.01); *H01L 25/043* (2013.01); *H01L 25/074* (2013.01); *H01L 2225/06527* (2013.01); *H01L 2225/06555* (2013.01)

(58) Field of Classification Search
CPC ................. H01L 25/0652; H01L 25/50; H01L 2225/06527; H01L 2225/06555; H01L 25/043; H01L 25/0657; H01L 25/074; H01L 25/0756; H01L 25/112; H01L 25/117
See application file for complete search history.

(56) References Cited

U.S. PATENT DOCUMENTS

| | | | |
|---|---|---|---|
| 4,811,082 A | 3/1989 | Jacobs et al. | |
| 4,990,462 A | 2/1991 | Sliwa, Jr. | |
| 5,075,253 A | 12/1991 | Sliwa, Jr. | |
| 5,380,681 A | 1/1995 | Hsu | |

(Continued)

FOREIGN PATENT DOCUMENTS

| | | |
|---|---|---|
| CN | 1400661 A | 3/2003 |
| CN | 102169841 A | 8/2011 |

(Continued)

*Primary Examiner* — Julio J Maldonado
*Assistant Examiner* — Farun Lu
(74) *Attorney, Agent, or Firm* — Slater Matsil, LLP

(57) ABSTRACT

An embodiment package includes a first fan-out tier, fan-out redistribution layers (RDLs) over the first fan-out tier, and a second fan-out tier over the fan-out RDLs. The first fan-out tier includes one or more first device dies and a first molding compound extending along sidewalls of the one or more first device dies. The second fan-out tier includes one or more second device dies bonded to fan-out RDLs, a dummy die bonded to the fan-out RDLs, and a second molding compound extending along sidewalls of the one or more second device dies and the dummy die. The fan-out RDLs electrically connects the one or more first device dies to the one or more second device dies, and the dummy die is substantially free of any active devices.

19 Claims, 7 Drawing Sheets

(56) References Cited

U.S. PATENT DOCUMENTS

| | | |
|---|---|---|
| 5,481,133 A | 1/1996 | Hsu |
| 6,002,177 A | 12/1999 | Gaynes et al. |
| 6,187,678 B1 | 2/2001 | Gaynes et al. |
| 6,229,216 B1 | 5/2001 | Ma et al. |
| 6,236,115 B1 | 5/2001 | Gaynes et al. |
| 6,271,059 B1 | 8/2001 | Bertin et al. |
| 6,279,815 B1 | 8/2001 | Correia et al. |
| 6,355,501 B1 | 3/2002 | Fung et al. |
| 6,434,016 B2 | 8/2002 | Zeng et al. |
| 6,448,661 B1 | 9/2002 | Kim et al. |
| 6,461,895 B1 | 10/2002 | Liang et al. |
| 6,562,653 B1 | 5/2003 | Ma et al. |
| 6,570,248 B1 | 5/2003 | Ahn et al. |
| 6,600,222 B1 | 7/2003 | Levardo |
| 6,607,938 B2 | 8/2003 | Kwon et al. |
| 6,661,085 B2 | 12/2003 | Kellar et al. |
| 6,762,076 B2 | 7/2004 | Kim et al. |
| 6,790,748 B2 | 9/2004 | Kim et al. |
| 6,836,025 B2 | 12/2004 | Fujisawa et al. |
| 6,858,938 B2 | 2/2005 | Michii |
| 6,887,769 B2 | 5/2005 | Kellar et al. |
| 6,908,565 B2 | 6/2005 | Kim et al. |
| 6,908,785 B2 | 6/2005 | Kim |
| 6,924,551 B2 | 8/2005 | Rumer et al. |
| 6,943,067 B2 | 9/2005 | Greenlaw |
| 6,946,384 B2 | 9/2005 | Kloster et al. |
| 6,969,149 B2 | 11/2005 | Eguchi et al. |
| 6,975,016 B2 | 12/2005 | Kellar et al. |
| 7,037,804 B2 | 5/2006 | Kellar et al. |
| 7,056,807 B2 | 6/2006 | Kellar et al. |
| 7,087,538 B2 | 8/2006 | Staines et al. |
| 7,151,009 B2 | 12/2006 | Kim et al. |
| 7,157,787 B2 | 1/2007 | Kim et al. |
| 7,215,033 B2 | 5/2007 | Lee et al. |
| 7,247,950 B2 | 7/2007 | Fujisawa |
| 7,276,799 B2 | 10/2007 | Lee et al. |
| 7,279,795 B2 | 10/2007 | Periaman et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,345,350 B2 | 3/2008 | Sinha |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,494,845 B2 | 2/2009 | Hwang et al. |
| 7,528,494 B2 | 5/2009 | Furukawa et al. |
| 7,531,890 B2 | 5/2009 | Kim |
| 7,557,597 B2 | 7/2009 | Anderson et al. |
| 7,576,435 B2 | 8/2009 | Chao |
| 7,834,450 B2 | 11/2010 | Kang |
| 7,944,049 B2 | 5/2011 | Fujii |
| 7,973,310 B2 | 7/2011 | Wang et al. |
| 8,080,122 B2 | 12/2011 | Sunohara et al. |
| 8,361,842 B2 | 1/2013 | Yu et al. |
| 8,373,278 B2 | 2/2013 | Shinogi |
| 8,680,647 B2 | 3/2014 | Yu et al. |
| 8,703,542 B2 | 4/2014 | Lin et al. |
| 8,759,964 B2 | 6/2014 | Pu et al. |
| 8,778,738 B1 | 7/2014 | Lin et al. |
| 8,779,599 B2 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 9,299,678 B2 * | 3/2016 | Kyozuka ............. H01L 23/3157 |
| 2004/0026789 A1 | 2/2004 | Michii |
| 2005/0046002 A1 | 3/2005 | Lee et al. |
| 2006/0278975 A1 * | 12/2006 | Tsao .................... H01L 23/3128 257/720 |
| 2007/0210456 A1 | 9/2007 | Takezawa et al. |
| 2008/0169549 A1 | 7/2008 | Carson |
| 2008/0224322 A1 | 9/2008 | Shinogi |
| 2009/0189268 A1 | 7/2009 | Kado et al. |
| 2010/0140779 A1 * | 6/2010 | Lin ................... H01L 23/49816 257/690 |
| 2010/0159643 A1 | 6/2010 | Takahashi et al. |
| 2011/0068468 A1 | 3/2011 | Lin et al. |
| 2011/0215470 A1 | 9/2011 | Chen et al. |
| 2011/0278732 A1 | 11/2011 | Yu et al. |
| 2011/0291288 A1 | 12/2011 | Wu et al. |
| 2011/0316572 A1 | 12/2011 | Rahman |
| 2012/0049366 A1 | 3/2012 | Zeng |
| 2012/0061856 A1 | 3/2012 | Vora |
| 2012/0097944 A1 | 4/2012 | Lin et al. |
| 2012/0181648 A1 | 7/2012 | Andry et al. |
| 2012/0217654 A1 | 8/2012 | Shin et al. |
| 2012/0286814 A1 | 11/2012 | Wang et al. |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0307140 A1 | 11/2013 | Huang et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |
| 2016/0035664 A1 * | 2/2016 | We .................... H01L 23/49838 257/686 |

FOREIGN PATENT DOCUMENTS

| | | |
|---|---|---|
| CN | 102194804 A | 9/2011 |
| CN | 103594451 A | 2/2014 |
| JP | 2010144369 | 8/2010 |
| KR | 100907232 B1 | 7/2009 |
| TW | 201027692 | 7/2010 |
| TW | 201131715 | 9/2011 |

* cited by examiner

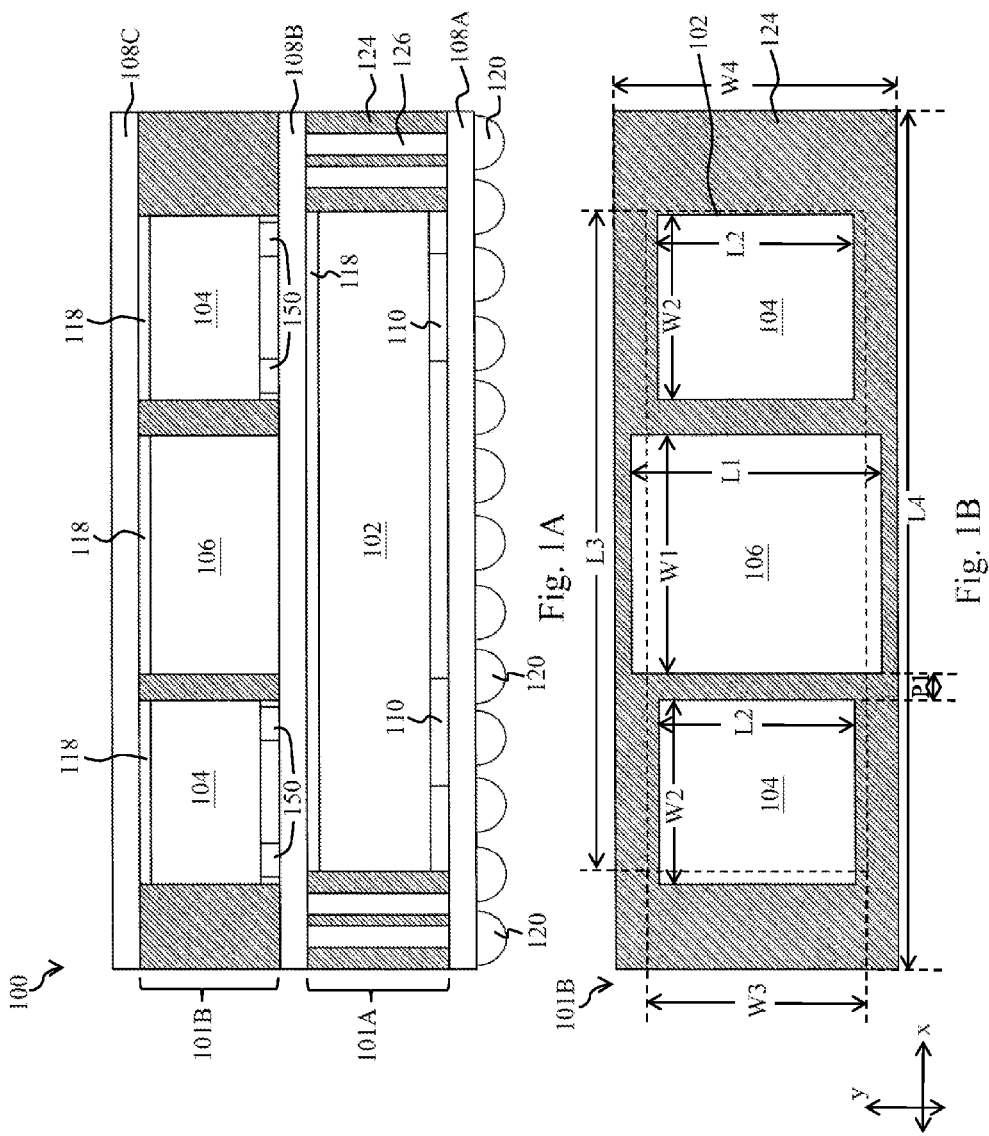

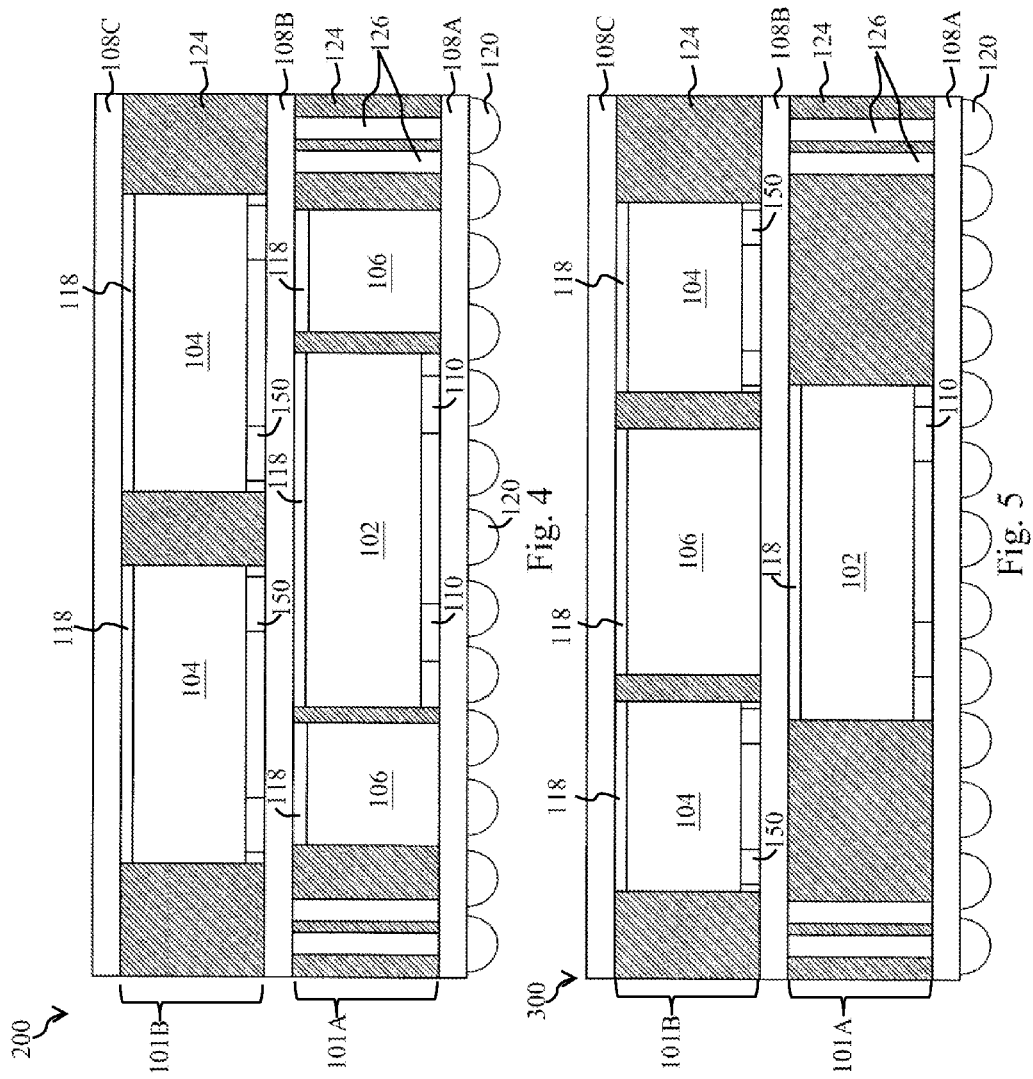

FAN-OUT STACKED SYSTEM IN PACKAGE (SIP) HAVING DUMMY DIES AND METHODS OF MAKING THE SAME

BACKGROUND 3D package applications such as package-on-package (PoP) are becoming increasingly popular and widely used in mobile devices because they can enhance electrical performance by integrating logic chips (e.g., application processors (APs)), high capacity/bandwidth memory chips (e.g., dynamic random access memory (DRAM), wide input/out (WIO) chips, low power double data rate X (LPDDR$_x$) chips, and the like), and/or other heterogeneous chips (e.g., sensors, micro-electro-mechanicals (MEMs), networking devices, and the like), for instance. Existing PoP devices and packaging structures face challenges to meet fine channels and high density routing requirements of next-generation applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A and 1B illustrate cross-sectional and top down views of a first device package in accordance with some embodiments.

FIG. 4 illustrates a cross-sectional view of a second device package in accordance with some embodiments.

FIG. 5 illustrates a cross-sectional view of a third device package in accordance with some embodiments.

DETAILED DESCRIPTION

Figure 2A:
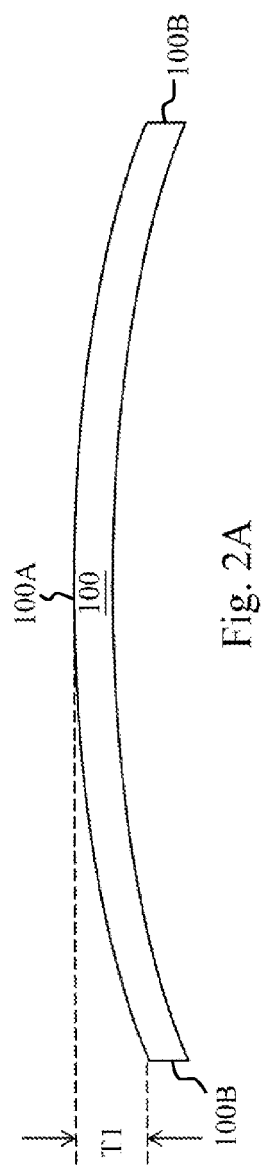
FIGS. 2A through 2C illustrate various cross-sectional profiles of the first device package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some aspects, various example embodiments may enable a thin package profile integrating memory (e.g., DRAM, LPDDR$_x$, WIO, and the like) and logic chips, for example. Improved memory capacity and bandwidth may be achieved in thin-profiled stacked fan-out packages. Embodiments may use through-intervias (TIVs) as an option for electrical routing in lieu of or in addition to through substrate vias (TSVs), thus reducing silicon asset penalty and manufacturing cost. Embodiments may also provide better thermal performance in stacked system in package (SiP) and lower RLC parasitic effects.

In some embodiments, various device chips are integrated in a fan-out SiP. Various chips may be disposed in stacked fan-out tiers, and RDLs between each tier provide electrical connection between the chips and/or external connectors. For example, a core logic chip (e.g., an application processor (AP), system on chip (SoC), and the like) communicates with chips in other fan-out tiers using TIVs (disposed in each fan-out tier) and RDLs (disposed over and/or under each tier) of the package. TSVs may also be optionally employed in the chips for further electrical connection. Each fan-out tier of the device package may include one or more of: dynamic random access memory (DRAM), low power-double data rate X (LPDDR$_x$), wide input/output (WIO) memory, NAND flash, SRAM catch, and the like memory chips. Other types of chips, such as, logic, analog, sensor, networking, micro-electro-mechanical (MEMS), and the like, may also be included. The number of chips in each fan-out tier may be greater than or equal to one. The integrated fan-out SiP may be used for various applications, such as, mobile computing, mobile health (e.g., heath monitoring), wearable electronics, internet of things (IoT), big data, and the like.

The varying configurations of dies among different fan-out tiers may result in coefficient of thermal expansion (CTE) mismatch. For example, referring to FIG. 1A, each fan-out tier 101 (labeled 101A and 101B) includes one or more semiconductor dies 102/104, which have an effective CTE of around 3.0 due to the semiconductor material (e.g., silicon) present in such dies 102/104. Tiers 101 may further comprise various other materials (e.g., a molding compound 124 and/or TIVs 126), which may have a higher effective CTE. The presence of dies 102 and 104 in tiers 101 reduces the overall effective CTE of each tier 101 from that of the surrounding material (e.g., molding compound 124 and/or TIVs 126) as a function of the total size of dies in each tier. For example, tiers having larger dies have a correspondingly lower effective CTE than tiers with smaller dies.

Various dies in an embodiment package may have varying sizes. For example, in some current applications, logic dies (e.g., die 102) may occupy a significantly larger surface area/footprint than a combined surface area of multiple memory dies (e.g., dies 104). Thus, absent other dies, the effective CTE of a fan-out tier having a logic die may be lower than the effective CTE of fan-out tier having multiple memory dies. The CTE mismatch of various tiers may result in warpage when the device package is at room temperature (e.g., around 25° Celsius) as well as when the device package is exposed to high temperatures (e.g., around 260° Celsius or higher). For example, the resulting package may have an unacceptably large "crying" profile illustrated in FIG. 2A where a middle portion 100A of the package is higher than edge portions 100B of the package.

Figure 2B:
Figure 2C:
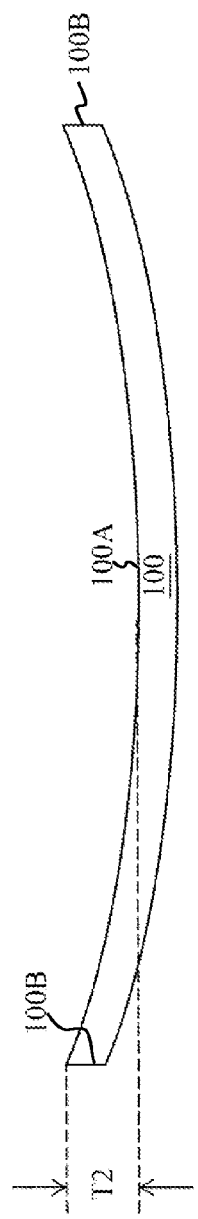

In some embodiments, dummy dies (e.g., dummy dies 106) may be inserted in one or more fan-out tiers 101 in order to reduce CTE mismatch and improve the warpage profile of the resulting package. Dummy dies may comprise any suitable material for adjusting the effective CTE of a fan-out tier to a desired level. The dummy dies may include a material for lowering the effective CTE of a tier, such as silicon or glass. In other embodiments, the dummy die may include a material for raising the effective CTE of a tier, such as copper or a polymer. By including dummy dies, a difference between a highest and lowest point of a package having a crying profile (dimension T1 in FIG. 2A) may be reduced. Alternatively, the inclusion of dummy dies may result in a package having a substantially level lateral surface as illustrated by FIG. 2B. In yet other embodiments, the inclusion of dummy dies may result in a package having a "smiling" profile illustrated in FIG. 2C where a middle portion 100A is lower than edge portions 100B.

FIGS. 1A and 1B illustrate the inclusion of a dummy die 106 in a device package 100 to mitigate warpage due to CTE mismatch amongst tiers. FIG. 1A illustrates a cross sectional view of two fan-out tiers 101A and 101B, which may be part of a larger device package 100 having any number of fan-out tiers. FIG. 1B illustrates a corresponding top-down view of tier 101B. Although FIG. 1A illustrates a particular package configuration, one or more dummy dies 106 may be integrated in a device tier having any package configuration in other embodiments.

Fan-out tier 101A includes a logic die 102, a molding compound 124 encircling die 102, and TIVs 126 extends through molding compound 124. Logic die 102 may be an AP, SoC, and the like, and logic die 102 may provide core control functionality in package 100. In some embodiments, core logic die 102 may be a die in the device package that consumes the most power (e.g., the most heat generating die). Die 102 may include a semiconductor substrate, active devices, and an interconnect structure (not shown). The substrate may be a bulk silicon substrate although other semiconductor materials including group III, group IV, and group V elements may also be used. Alternatively, the substrate may be a silicon-on-insulator substrate, a germanium-on-insulator substrate, and the like. Active devices such as transistors may be formed at the top surface of the substrate. An interconnect structure may be formed over the active devices and a front side of the substrate. The term "face" or "front" surface or side is a term used herein implying the major surface of the device upon which active devices and interconnect layers are formed. Likewise, the "back" surface of a die is that major surface opposite to the face or front.

The interconnect structure may include inter-layer dielectric (ILD) and/or inter-metal dielectric (IMD) layers containing conductive features (e.g., conductive lines and vias comprising copper, aluminum, tungsten, combinations thereof, and the like) formed using any suitable method. The ILD and IMDs may include low-k dielectric materials having k values, for example, lower than about 4.0 or even 2.8 disposed between such conductive features. In some embodiments, the ILD and IMDs may be made of, for example, silicon oxide, SiCOH, a polymer, and the like. The interconnect structure electrically connects various active devices to form functional circuits within die 102, such as logic control circuits.

Input/output (I/O) and passivation features may be formed over the interconnect structure. For example, contact pads may be formed over the interconnect structure and may be electrically connected to the active devices through the various conductive features in the interconnect structure. Contact pads may comprise a conductive material such as aluminum, copper, and the like. Furthermore, a passivation layer may be formed over the interconnect structure and the contact pads. In some embodiments, the passivation layer may be formed of materials such as silicon oxide, un-doped silicate glass, silicon oxynitride, and the like. Other suitable passivation materials may also be used. Portions of the passivation layer may cover edge portions of the contact pads. Pillar bumps 110 may be disposed over contact pads, and a dielectric material 112 (e.g., a passivation layer) may be disposed between adjacent pillar bumps 110. In some embodiments, dielectric material 112 may comprise a polymer.

Pillar bumps 110 may electrically connect die 102 to front side RDLs 108A, which may extend laterally past edges of die 102. In the orientation of package 100 illustrated by FIG. 1A, RDLs 108A are disposed on a bottom surface of fan-out tier 101A. External connectors 120 (e.g., ball grid array (BGA) balls, or the like) may be formed on RDLs 108A, which may electrically connect die 102 to such connectors. Connectors 120 may further bond package 100 to other package components such as other device dies, interposers, package substrates, printed circuit boards, a mother board, and the like. In other embodiments, RDLs 108A may electrically connect die 102 to other fan-out tiers formed under RDLs 108A. In such embodiments, external connectors 120 may be disposed on a different portion of package 100.

Back side RDLs 108B may be disposed on a top surface of fan-out tier 101A. TIVs 126 (e.g., extending through molding compound 124) may provide signal paths between RDLs 108A and 108B, and die 102 may be electrically connected to RDLs 108A, 108B, and TIVs 126 by p 110. In some embodiments, die 102 may further include TSVs (not shown) to provide signal paths between RDLs 108A and 108B. Die 102 may be attached to RDLs 108B by a glue layer (e.g., a die attach film (DAF) layer 118).

A second fan-out tier 101B is disposed over RDLs 108B. Tier 101B includes dies 104, which may be smaller than die 102. Dies 104 may be electrically connected to RDLs 108B (and thus die 102, TIVs 126, and RDLs 108A) by connectors 150 (e.g., pillar bumps). In some embodiments, dies 104 may include similar features (e.g., a semiconductor substrate, active devices, interconnect layers, contact pads, and the lie) as die 102, and functional circuits in dies 104 may provide a same or different function as die 102. For example, dies 104 may be any type of integrated circuit, such as a memory die (e.g., DRAM, LPDDR$_x$, WIO, NAND flash, and the like), analog circuit, digital circuit, mixed signal, sensor die, micro-electro-mechanical (MEMS) die, networking die, and the like. Additional RDLs 108C may be disposed over fan-out tier 101B, and dies 104 may be attached to RDLs 108C by an adhesive layer 118. In some embodiments, TSVs (not shown) in dies 104 may provide signal paths between RDLs 108B and 108C. In some embodiments, TIVs may also be formed in fan-out tier 101B to provide signal paths between RDLs 108B and 108C. Additional fan-out tiers and/or interconnect features may be formed over RDLs 108C and/or in tier 101B to electrically connect various dies and RDLs.

As illustrated by the top-down view of FIG. 1B, die 102 (shown in ghost) occupies a larger footprint than dies 104 combined. For example, in the illustrated embodiment, die 102 has a lengthwise dimension L1, a widthwise dimension W1, and a surface area of L1 times W1. In some embodiments, a ratio of L1/W1 is about 0.8 to about 1.2. Dies 104 each have a lengthwise dimension L2, a widthwise dimension W2, and a surface area L2 times W2. In some embodiments, a ratio of L2/W2 is close to about 1.0, for example about 0.8 to about 1.2. In embodiments, the surface area of die 102 (e.g., L1 times W1) is greater than the combined surface area of dies 104 (e.g., twice L2 times W2). In various embodiments, various widths (e.g., W1 and/or W2) may be about 3 mm to about 11 mm. In such embodiments, various lengths (e.g., L1 and/or L2) may be about 10 mm to about 13 mm. Other dimensions and/or ratios for dies 102 and/or 104 may also be used in other embodiments.

Absent dummy die 106, tier 101A would comprise more semiconductor material (e.g., silicon) and have a lower effective CTE than tier 101B. Thus, at least one dummy die 106 is included in tier 101B in order to reduce the effective CTE of tier 101B to a desired level (e.g., close to an effective CTE of tier 101A). Dummy die 106 may not include any functional circuitry or active devices. Dummy die 106 is included in order to lower CTE mismatch between tiers 101A and 101B, and dummy die 106 may not perform any electrical functions and electrically isolated from other features (e.g., RDLs 108 and/or dies 102/104) in package 100. For example, dummy die 106 may be a block of substantially pure silicon to increase the amount of semiconductor material in tier 101B, reducing CTE mismatch between tiers 101A and 101B. In other embodiments, dummy die 106 may comprise another suitable material (e.g., glass) for reducing the effective CTE in tier 101B.

In some embodiments, dummy die 106 has a lengthwise dimension L3 and a widthwise dimension W3. In some embodiments, a ratio of L3/W3 is close to about 2.0. A distance between dies (e.g., P1) in tier 101B may be about 0.1 mm. Fan-out tier 101B may have a lengthwise dimension L4 and a widthwise dimension W4. Other configurations having different dimensions and spacing for dummy die 106 may also be used. The material and size of dummy die 106 may be selected based on a desired effective CTE of the fan-out tier (e.g., tier 101B) in which dummy die 106 is disposed. For example, referring to the fan-out tier configuration of FIG. 1B, the effective CTE of tier 101B along the x-axis across dies 104/106 may be calculated according to the following formula:

$$2\alpha_{Si} \times \frac{W2}{L4} + \alpha_{dummy} \times \frac{W1}{L4} \times \alpha_{MC} \times \frac{L4 - 2 \times W2 - W1}{L4},$$

where $\alpha_{Si}$ is the CTE of silicon, $\alpha_{dummy}$ is the CTE of the material of dummy die 106 (e.g., silicon or glass), and $\alpha_{MC}$ is the CTE of molding compound 124. The effective CTE of tier 101B along the y-axis across dummy die 106 may be calculated according to the following formula:

$$\alpha_{dummy} \times \frac{L1}{W4} + \alpha_{MC} \times \frac{W4 - L1}{W4}.$$

Other models for determining a size and material of dummy die 106 to achieve a desired effective CTE may be used.

It has been observed that packages having relatively low warpage may be attained when a ratio of the total surface area of dies in tier 101B (e.g., dies 104/106) to the dies in tier 101A (e.g., die 102) is between about 0.8 to about 1.2. For example, a height difference in the top surface the resulting package (e.g., represented as T1 in FIG. 2A) at high temperatures may be reduced from about 140 μm in current applications to less than about 60 μm when a dummy die as described above is included. It has also been observed that relatively low warpage may be attained when a ratio of the effective CTE of tier 101B to the effective CTE of tier 101A is about 0.9 to about 1.1.

Furthermore, the desired effective CTE may be selected based on an effective CTE of surrounding device layers (e.g., RDLs 108) in additional to surrounding fan-out tiers (e.g., tier 101A). It has been observed that surrounding device layers may affect the warpage of tier 101B at different temperatures. For example, warpage due to CTE mismatch between fan-out tier 101B and RDLs 108B may be more prevalent at room temperature while warpage due to CTE mismatch between fan-out tiers 101A and 101B may be more prevalent at high temperatures. Therefore, when selecting a desired effective CTE of dummy die 106, the effective CTEs of all surrounding layers, including RDLs 108 and tier 101A may be taken into account.

Package 100 may also include additional features, such as heat dissipation features (not shown). For example, a thermal interface material and a heat dissipation lid may be disposed over a top-most fan-out tier (e.g., tier 101B/RDLs 108C). The TIM may comprise, for example, a polymer having a good thermal conductivity, which may be between about 3 watts per meter kelvin (W/m·K) to about 5 W/m·K or more. The heat dissipation lid may further have a high thermal conductivity, for example, between about 200 W/m·K to about 400 W/m·K or more, and may be formed using a metal, a metal alloy, grapheme, carbon nanotubes (CNT), and the like.

Figure 3A:
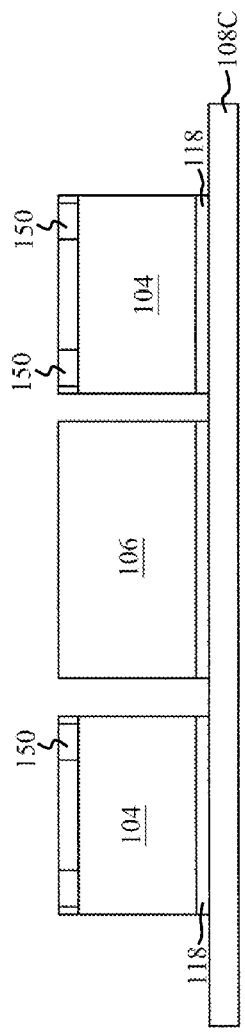
FIGS. 3A through 3G illustrate various cross-sectional views of intermediary steps of manufacturing the first device package in accordance with some embodiments.

FIGS. 3A through 3G illustrate various intermediary steps of manufacturing the fan-out tiers of FIG. 1A in accordance with some embodiments. In FIG. 3A, backside RDLs 108C is provided. RDLs 108C may be formed on a carrier (not illustrated). RDLs 108C may include one or more layers of dielectric material having conductive features (not shown), such as conductive lines and vias, formed therein. The dielectric material in RDLs 108C may be formed of any suitable material (e.g., polyimide (PI), polybenzoxazole (PBO), BCB, epoxy, silicone, acrylates, nano-filled pheno resin, siloxane, a fluorinated polymer, polynorbornene, an oxide, a nitride, and the like) using any suitable method (e.g., a spin-on coating technique, sputtering, and the like). In some embodiments, formation of RDLs 108C may include patterning the dielectric material (e.g., using photolithography and/or etching processes) and forming conductive features in and/or on the patterned dielectric layers. For example, conductive features could be formed by depositing a seed layer, using a mask layer to define the shape of the conductive features, and using an electroless/electrochemical plating process.

Semiconductor dies 104 and dummy die 106 may be bonded to BS RDLs using adhesive layer 118. As described above, dies 104 may be include active devices/functional circuitry while dummy die 106 may not include any active devices or functional circuitry. A size of dummy die 106 may be determined based on the size of dies 104 and a desired effective CTE of the fan-out tier (e.g., tier 101B) being formed.

Figure 3B:
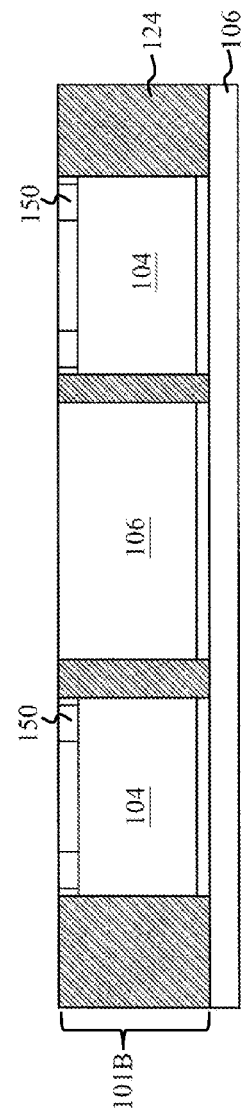

Next, in FIG. 3B, a wafer level molding/grind back may be performed. For example, a molding compound 124 may be dispensed between the bonded dies 104/106. Molding compound 124 may include any suitable material such as an epoxy resin, a molding underfill, and the like. Suitable methods for forming molding compound 124 may include compressive molding, transfer molding, liquid encapsulent molding, and the like. For example, molding compound 124 may be dispensed between dies 104/106 in liquid form. Subsequently, a curing process is performed to solidify molding compound 124. The filling of molding compound 124 may overflow dies 104/106 so that molding compound 124 covers top surfaces of dies 104/106. A mechanical grinding, chemical mechanical polish (CMP), or other etch back technique may be employed to remove excess portions of molding compound 124 and expose connectors (e.g., pillars bumps 150) of die 104. After planarization, top surfaces of molding compound 124, dies 104, and dummy die 106 may be substantially level. Thus, fan-out tier 101B is completed in package 100.

Figure 3C:
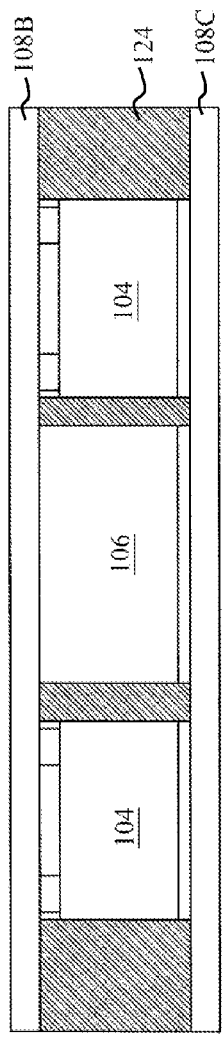
Figure 3D:
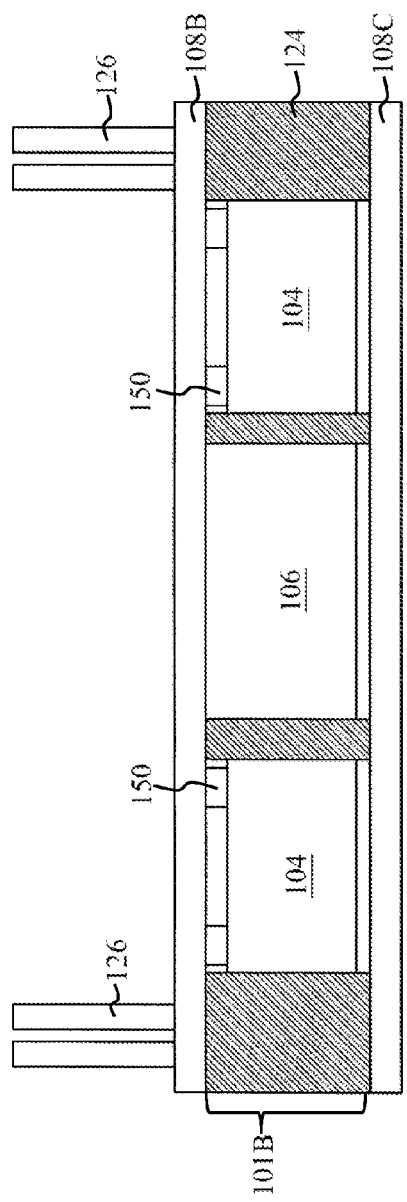
Figure 3E:
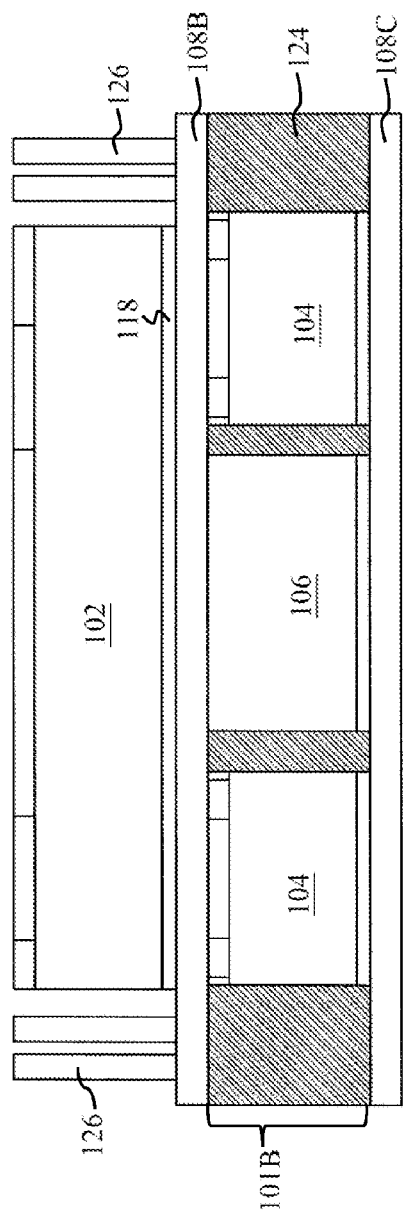

FIG. 3C illustrates the formation of RDLs 108B over tier 101B. RDLs 108B may be electrically connected to pillar bumps 150 of dies 104B. In FIG. 3D, TIVs 126 may be formed over RDLs 108B. TIVs 126 may comprise a conductive material (e.g., copper) and may be formed by any suitable process. For example, a patterned mask layer (not shown) having openings may be used to define the shape of such TIVs. The openings may expose a seed layer (not shown) formed over RDLs 108B. The openings in the mask layer may be filled with a conductive material (e.g., in an electroless plating process or electrochemical plating process). The plating process may uni-directionally fill openings (e.g., from the seed layer upwards) in the patterned photoresist. Uni-directional filling may allow for more uniform filling of such openings, particularly for high aspect ratio TIVs. Alternatively, a seed layer may be formed on sidewalls and bottom surfaces of openings in the patterned mask layer, and such openings may be filled multi-directionally. Subsequently, the patterned mask layer may be removed in an ashing and/or wet strip process. Excess portions of the seed layer may also be removed using an etching process, leaving TIVs 126 over and electrically connected to RDLs 108B. TIVs 126 can also be formed using copper wire stud by copper wire bond processes (e.g., where mask, photoresist, and plating are not required). In FIG. 3E, another semiconductor die (e.g., a core logic die 102) may be bonded (e.g., using adhesive layer 118) to an opposing surface of RDLs 108B as dies 104/106.

Figure 3F:
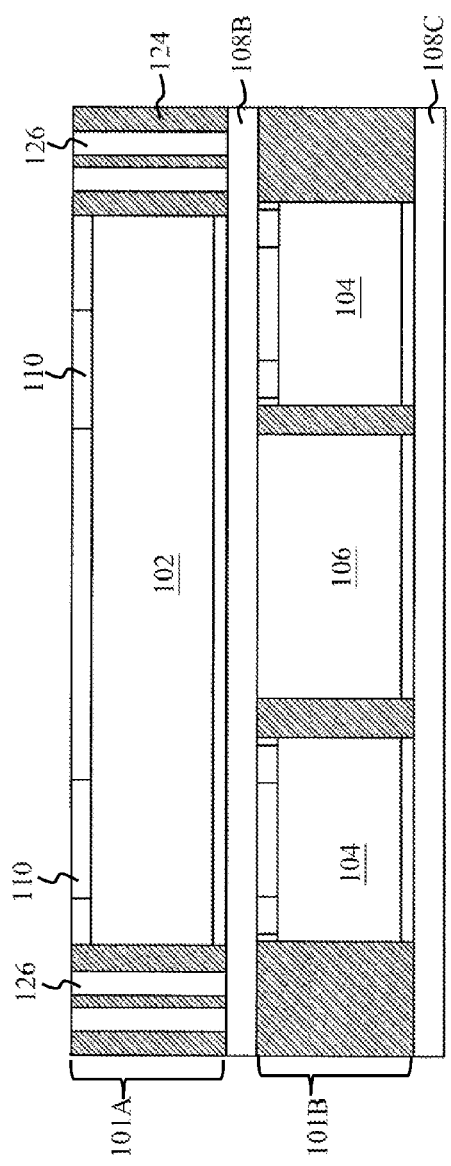

Subsequently, another wafer level molding/grind back may be performed as illustrated by FIG. 3F. For example, a molding compound 124 may be dispensed between die 102 and various TIVs 126, and a planarization may be performed to expose connectors (e.g., pillar bumps 110) on die 102. Thus, a second fan-out tier 101A is formed in the device package. In some embodiments, a ratio of the surface area of dies in tier 101A (e.g., die 102) to the surface area of dies in tier 101B (e.g., dies 104/1600) is about 0.8 to about 1.2.

Figure 3G:
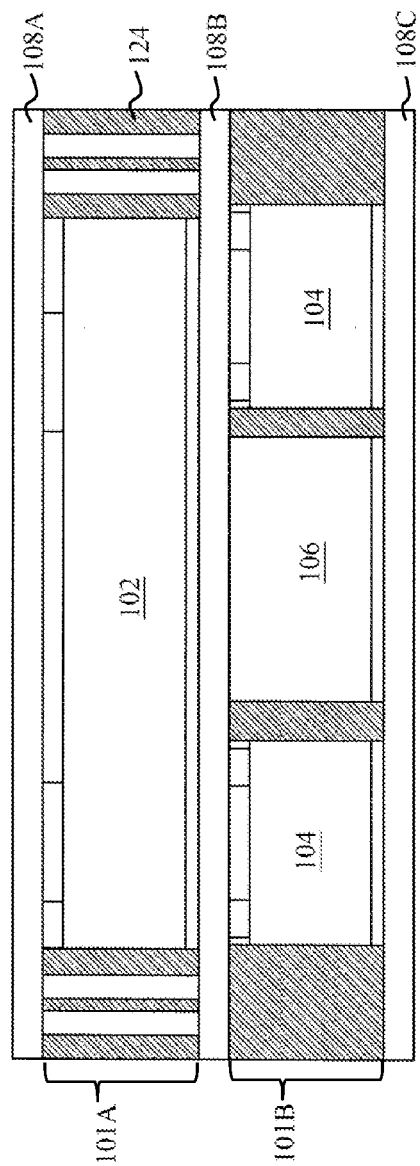

Next, in FIG. 3G, one or more RDLs (RDLs 108A) is formed over tier 101A using a similar process as described above. RDLs 108A may be electrically connected to die 102 and the TIVs 126. TIVs 126 may further electrically connect RDLs 108A and 108B. Additional features (e.g., external connectors, additional tiers, additional RDLs, functional dies, dummy dies, packages, heat dissipation features, and the like) may subsequently be formed.

FIG. 4 illustrates a cross-sectional view of a device package 200 in accordance with some alternative embodiments. Package 200 may be substantially similar to package 100 where like reference numerals represent like elements. However, in package 200, die 102 may occupy a smaller footprint than dies 104. Thus, absent dummy dies 106, an effective CTE of tier 101A may be lower than an effective CTE of tier 101B. Thus, dummy dies 106 comprising a relatively low CTE material (e.g., silicon or glass) may be included in tier 101A to lower its effective CTE, reducing CTE mismatch and warpage. Furthermore, multiple dummy dies 106 may be included in a fan-out tier at various locations based on processing limitations, layout design, manufacturing efficiency, and the like.

FIG. 5 illustrates a cross-sectional view of a device package 300 in accordance with some alternative embodiments. Package 300 may be substantially similar to package 200 where like reference numerals represent like elements. Similar to package 200, in package 300, die 102 may occupy a smaller footprint than dies 104. Thus, absent dummy dies 106, an effective CTE of tier 101A may be lower than an effective CTE of tier 101B. However, in package 300, dummy die 106 may be included in tier 101B to raise its effective CTE, reducing CTE mismatch and warpage. For example, dummy die 106 may comprise a relatively high CTE material (e.g., copper having a CTE of about 18). When a high CTE dummy die 106 is included in tier 101B, the effective CTE of tier 101B is increased. Thus, in various embodiments, dummy dies 106 may be used to either increase or decrease effective CTE to a desired level based on surrounding layers (e.g., RDLs, other tiers, and the like).

Figure 6:
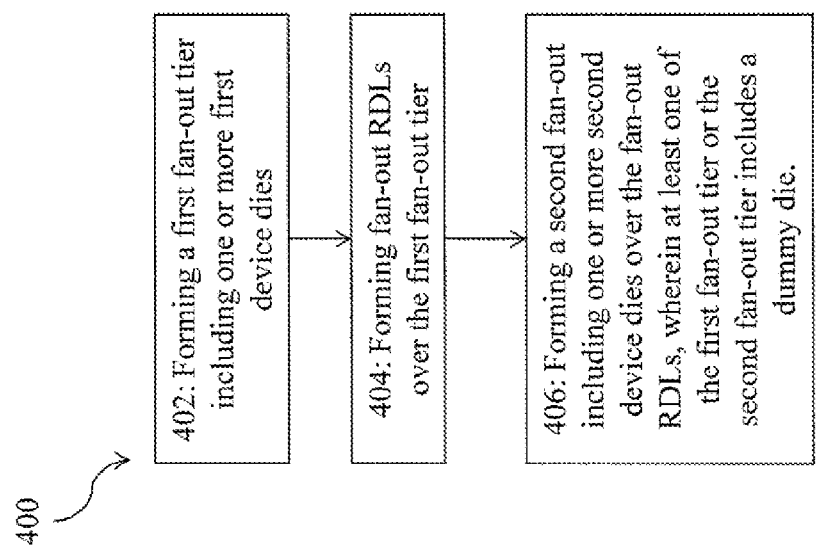
FIG. 6 illustrates a process flow for forming a device package with dummy dies in accordance with some other embodiments.

FIG. 6 illustrates a process flow 400 for forming a device package in accordance with some embodiments. In step 402, a first fan-out tier (e.g., tier 101A) is formed. The first fan-out tier may include a device die (e.g., logic die 102) and a molding compound (e.g., molding compound 124) extending around the device die. In step 404, one or more fan-out RDLs (e.g., RDLs 108B) is formed over the first fan-out tier. The fan-out RDLs may be electrically connected to the device die using connectors (e.g., pillar bumps 110) in the device die. In step 406, a second fan-out tier (e.g., fan-out tier 101B) is formed over the one or more RDLs. The second fan-out tier may include one or more device dies (e.g., dies 104). Furthermore at least one of the first fan-out tier or the second fan-out tier includes one or more dummy dies (e.g., dummy dies 106), and dimensions of the dummy die may be selected in accordance with a desired CTE of the fan-out tier. In some embodiments, the desired CTE of the fan-out tier may be in accordance with neighboring device package tiers (e.g., other fan-out tiers and/or RDLs).

Various embodiments described herein include core logic dies bonded to other dies (e.g., memory, logic, sensor, networking, and the like circuits) in various package configurations. Each die may be disposed in various fan-out tiers. Dummy dies may be included in various fan-out tiers, and a size and/or material of the dummy dies may be selected in order to reduce CTE mismatch amongst various fan-out tiers. RDLs may be disposed on a front and/or back side of such fan-out tiers, and TIVs extending between tiers may provide electrical connection between different RDLs. Thus, dies in a package may be electrically connected to other dies and/or external connectors.

In accordance with an embodiment, a package includes a first fan-out tier, fan-out redistribution layers (RDLs) over the first fan-out tier, and a second fan-out tier over the fan-out RDLs. The first fan-out tier includes one or more first device dies and a first molding compound extending along sidewalls of the one or more first device dies. The second fan-out tier includes one or more second device dies bonded to fan-out RDLs, a dummy die bonded to the fan-out RDLs, and a second molding compound extending along sidewalls of the one or more second device dies and the dummy die. The fan-out RDLs electrically connects the one or more first device dies to the one or more second device dies, and the dummy die is substantially free of any active devices.

In accordance with another embodiment, a package includes a first device tier, a second device tier, and fan-out redistribution layers (RDLs) between the first and second device tiers. The first device tier includes one or more first device dies and a first molding compound encircling the one or more first dies. The second device tier includes one or more second device dies, a dummy die, a second molding compound encircling the one or more second device dies and the dummy die. A size and material of the dummy die is in accordance with a desired effective coefficient of thermal expansion (CTE) of the second device tier. The one or more first device dies and the one or more second device dies are electrically connected to the fan-out RDLs.

In accordance with yet another embodiment, a method for forming a package includes forming a first fan-out tier, forming fan-out redistribution layers (RDLs) over the first fan-out tier, and forming a second fan-out tier over the fan-out RDLs. Forming the first fan-out tier includes forming a first molding compound around one or more first device dies. Forming the second fan-out tier includes bonding one or more second device dies to the fan-out RDLs, bonding a dummy die to the fan-out RDLs, and dispensing a second molding compound around the one or more second device dies and the dummy die. A size and material of the dummy die is selected in accordance with a desired effective coefficient of thermal expansion (CTE) of the second fan-out tier.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
   a first fan-out tier comprising:
      one or more first device dies; and
      a first molding compound extending along sidewalls of the one or more first device dies;
   fan-out redistribution layers (RDLs) over the first fan-out tier; and
   a second fan-out tier over the fan-out RDLs, wherein the second fan-out tier comprises:
      one or more second device dies bonded to the fan-out RDLs, wherein the fan-out RDLs electrically connects the one or more first device dies to the one or more second device dies;
      a dummy die bonded to the fan-out RDLs, wherein the dummy die is substantially free of any active devices, wherein the one or more first device dies has a first total surface area, wherein the one or more second device dies and the dummy die has a second total surface area, and wherein a ratio of the first total surface area to the second total surface area is about 0.8 to about 1.2; and
      a second molding compound extending along sidewalls of the one or more second device dies and the dummy die.

2. The package of claim 1, wherein a size of the dummy die, a material of the dummy die, or a combination thereof is in accordance with a desired effective coefficient of thermal expansion (CTE) of the second fan-out tier.

3. The package of claim 2, wherein the desired effective CTE is in accordance with an effective CTE of the first fan-out tier, an effective CTE of the fan-out RDLs, or a combination thereof.

4. The package of claim 1, wherein the one or more first device dies has a first total surface area, wherein the one or more second device dies has a third total surface area, wherein the first total surface area is greater than the third total surface area, and wherein the dummy die comprises silicon or glass.

5. The package of claim 1, wherein the one or more first device dies has a first total surface area, wherein the one or more second device dies has a second total surface area, wherein the first total surface area is less than the second total surface area, and wherein the dummy die comprises copper.

6. The package of claim 1, wherein the first fan-out tier has a first effective coefficient of thermal expansion (CTE), wherein the second fan-out tier has a second effective CTE, and wherein a ratio of the first effective CTE to the second effective CTE is about 0.9 to about 1.1.

7. The package of claim 1, wherein the dummy die is disposed between two of the one or more second device dies.

8. The package of claim 1, wherein at least one of the one or more second device dies is disposed between the dummy die and a second dummy die.

9. A package comprising:
   a first device tier comprising:
      one or more first device dies; and
      a first molding compound encircling the one or more first device dies;
   a second device tier comprising:
      one or more second device dies;
      a dummy die, wherein a size and material of the dummy die is in accordance with a desired effective coefficient of thermal expansion (CTE) of the second device tier; and
      a second molding compound encircling the one or more second device dies and the dummy die, wherein a first total surface area of the one or more first device dies is greater than a second total surface area of the one or more second device dies, and wherein the dummy die has an effective coefficient of thermal expansion less than the second molding compound; and
   fan-out redistribution layers (RDLs) between the first and second device tiers, wherein the one or more first device dies and the one or more second device dies are electrically connected to the fan-out RDLs.

10. The package of claim 9, wherein the one or more first device dies has a first total surface area, wherein the one or more second device dies and the dummy die has a second total surface area, and wherein a ratio of the first total surface area to the second total surface area is about 0.8 to about 1.2.

11. The package of claim 9, wherein the dummy die is electrically isolated from the one or more first device dies, the one or more second device dies, and the fan-out RDLs.

12. The package of claim 9, wherein the dummy die comprises silicon, glass, or a combination thereof.

13. The package of claim 9, wherein a first one of the one or more second device dies is disposed between the dummy die and an additional dummy die, and wherein the second molding compound also encircles the additional dummy die.

14. The package of claim 9, wherein the dummy die is disposed between a first one of the one or more second device dies and a second one of the one or more second device dies.

15. A package comprising:
 a first semiconductor die;
 a first molding compound encapsulating the first semiconductor die, wherein all semiconductor dies encapsulated by the first molding compound has a first combined surface area;
 a second semiconductor die;
 a dummy die adjacent the second semiconductor die, wherein the dummy die is substantially free of any functional circuitry;
 a second molding compound encapsulating the second semiconductor die and the dummy die, wherein all semiconductor dies encapsulated by the second molding compound has a second combined surface area greater than the first combined surface area and wherein a coefficient of thermal expansion of the dummy die is greater than a coefficient of thermal expansion of the second molding compound; and
 redistribution layers disposed between and electrically connecting the first semiconductor die and the second semiconductor die, wherein the redistribution layers further extend between the first molding compound and the second molding compound.

16. The package of claim 15 further comprising conductive vias extending through the first molding compound or the second molding compound.

17. The package of claim 15, wherein the dummy die is disposed between the second semiconductor die and a third semiconductor die, wherein the second molding compound further encapsulates the third semiconductor die.

18. The package of claim 15, wherein the second semiconductor die is disposed between the dummy die and an additional dummy die, wherein the additional dummy die is substantially free of any active circuits, and wherein the second molding compound further encapsulates the additional dummy die.

19. The package of claim 15, wherein the dummy die comprises a metal.

* * * * *